(12) United States Patent
LI

(10) Patent No.: US 12,094,818 B2
(45) Date of Patent: Sep. 17, 2024

(54) FIN-BASED ANTIFUSE STRUCTURE HAVING GATE STACKS BIASED AT DIFFERENT GATE VOLTAGES AND METHOD OF MANUFACTURING THE SAME

(71) Applicant: Changxin Memory Technologies, Inc., Anhui (CN)

(72) Inventor: Xiong LI, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 412 days.

(21) Appl. No.: 17/519,408

(22) Filed: Nov. 4, 2021

(65) Prior Publication Data

US 2022/0375858 A1 Nov. 24, 2022

Related U.S. Application Data

(63) Continuation of application No. PCT/CN2021/120304, filed on Sep. 24, 2021.

(30) Foreign Application Priority Data

May 20, 2021 (CN) .......................... 202110551568.2

(51) Int. Cl.
H01L 23/525 (2006.01)
H01L 21/308 (2006.01)
(Continued)

(52) U.S. Cl.
CPC ...... *H01L 23/5256* (2013.01); *H01L 21/3085* (2013.01); *H01L 21/823431* (2013.01); *H01L 29/66795* (2013.01); *H01L 29/7851* (2013.01)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 6,858,914 B2    2/2005  Nanjo et al.
8,400,813 B2 *  3/2013  Lee .......................... G11C 17/16
                                                                365/96
(Continued)

FOREIGN PATENT DOCUMENTS

CN    1499627 A    5/2004
CN    101800083 A  8/2010
(Continued)

OTHER PUBLICATIONS

PCT International Search Report and the Written Opinion mailed Jan. 29, 2022, issued in related International Application No. PCT/CN2021/120280, with English translation (17 pages).
(Continued)

*Primary Examiner* — Younes Boulghassoul
(74) *Attorney, Agent, or Firm* — Kilpatrick Townsend & Stockton LLP

(57) ABSTRACT

A fuse structure and a method for manufacturing the same are provided. The fuse structure includes a substrate; a fin, located on the substrate and including a first fin region; and a gate stack structure, surrounding the top and side walls of the first fin region. The gate stack structure includes a first gate stack and a second gate stack. The first gate stack covers the first fin region, the second gate stack covers the first gate stack. The first gate stack is configured to receive a first gate voltage, the second gate stack is configured to receive a second gate voltage, and the first gate voltage is greater than the second gate voltage. The fuse structure reduces the area of the fuse unit and increase the integration level of the fuse circuit.

17 Claims, 5 Drawing Sheets

(51) Int. Cl.
*H01L 21/8234* (2006.01)
*H01L 29/66* (2006.01)
*H01L 29/78* (2006.01)

(58) Field of Classification Search
CPC .......... H01L 27/1211; H01L 27/10826; H01L 27/10879; H01L 29/41791; H01L 29/66795–66818; H01L 29/785–7856; H01L 2029/7857–7858; H01L 2924/13067; H01L 23/5252; H01L 23/5256; H01L 29/78696; H01L 29/42392; H01L 29/0673; H01L 29/66439; H01L 29/775; G11C 17/16; H10B 12/36; H10B 12/056; H10B 20/25

See application file for complete search history.

(56) References Cited

U.S. PATENT DOCUMENTS

| | | | |
|---|---|---|---|
| 9,431,497 B2 | 8/2016 | Toh et al. | |
| 9,536,883 B2 | 1/2017 | Hui et al. | |
| 9,613,899 B1* | 4/2017 | Adusumilli | H01L 21/02636 |
| 10,056,391 B2 | 8/2018 | Adusumilli et al. | |
| 10,692,811 B1 | 6/2020 | Yang et al. | |
| 2013/0051112 A1* | 2/2013 | Xia | G11C 17/12 |
| | | | 365/104 |
| 2016/0300622 A1* | 10/2016 | Hsu | H01L 27/0924 |
| 2017/0154890 A1* | 6/2017 | Jin | H01L 23/5252 |
| 2018/0061759 A1* | 3/2018 | Li | H01L 27/0886 |
| 2018/0061846 A1* | 3/2018 | Gan | H01L 29/7851 |
| 2019/0019751 A1 | 1/2019 | Qiao et al. | |
| 2019/0165045 A1* | 5/2019 | Chung | H10B 63/34 |
| 2022/0375857 A1* | 11/2022 | Li | H01L 23/5256 |

FOREIGN PATENT DOCUMENTS

| | | |
|---|---|---|
| CN | 102237337 A | 11/2011 |
| CN | 103456711 A | 12/2013 |
| CN | 103545291 A | 1/2014 |
| CN | 104183643 A | 12/2014 |
| CN | 104701296 A | 6/2015 |
| CN | 106449516 A | 2/2017 |
| CN | 107256855 A | 10/2017 |
| CN | 111261612 A | 6/2020 |
| JP | 2000-269471 A | 9/2000 |

OTHER PUBLICATIONS

PCT International Search Report and the Written Opinion mailed Feb. 15, 2022, issued in related International Application No. PCT/CN2021/120304, with English translation (16 pages).

* cited by examiner

FIN-BASED ANTIFUSE STRUCTURE HAVING GATE STACKS BIASED AT DIFFERENT GATE VOLTAGES AND METHOD OF MANUFACTURING THE SAME

CROSS-REFERENCE TO RELATED APPLICATIONS

This application is a continuation application of International Patent Application No.: PCT/CN2021/120304, filed on Sep. 24, 2021, which claims priority to Chinese Patent Application No.: 202110551568. 2, filed on May 20, 2021. The above-referenced applications are incorporated herein by reference in their entirety.

TECHNICAL FIELD

The present disclosure relates generally to the field of integrated circuit, and in particular, to an antifuse structure and a method for manufacturing the same.

BACKGROUND

Antifuse storage units are widely used for repairing purposes in integrated circuits. In a typical structure of an antifuse storage unit, a control gate is separated from an antifuse gate.

SUMMARY

One aspect of the present disclosure is directed to an antifuse structure. The structure includes a substrate; a fin, located on the substrate and including a first fin region: and a gate stack structure, surrounding the top and side walls of the first fin region. The gate stack structure includes a first gate stack and a second gate stack. The first gate stack covers the first fin region, the second gate stack covers the first gate stack. The first gate stack is configured to receive a first gate voltage, the second gate stack is configured to receive a second gate voltage, and the first gate voltage is greater than the second gate voltage.

Another aspect of the present disclosure is directed to a method for manufacturing an antifuse structure. The method includes providing a substrate, forming a fin on the substrate, and forming a gate stack structure. The fin includes a first fin region. The gate stack structure surrounds the top and side walls of the first fin region and includes a first gate stack and a second gate stack. The first gate stack covers the first fin region, and the second gate stack covers the first gate stack. The first gate stack is configured to receive a first gate voltage, the second gate stack is configured to receive a second gate voltage, and the first gate voltage is greater than the second gate voltage.

Details of one or more exemplary embodiments of the present disclosure are provided in the following accompanying drawings and descriptions. Various characteristics and advantages of the present disclosure will be apparent from the specification, accompanying drawings and claims.

BRIEF DESCRIPTION OF THE DRAWINGS

To describe the technical solutions in the embodiments of the present disclosure or conventional technology more clearly, brief descriptions are provided to the accompanying drawings required to describe the embodiments of the present disclosure or conventional technology. It is apparent that the accompanying drawings in the following description merely illustrate some of the embodiments of the present disclosure, and a person of ordinary skill in the art may derive other drawings according to these accompanying drawings without creative efforts.

Figure 1:
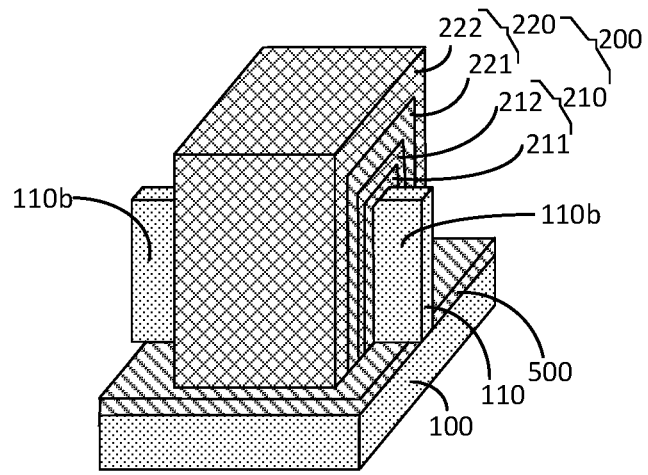
FIG. 1 is a schematic three-dimensional diagram of an antifuse structure according to one embodiment of the present disclosure.

Reference numerals represent the following: 100—substrate; 110—fin; 110a—first fin region; 110b—second fin region; 200—gate stack structure; 210—first gate stack; 211—first gate medium layer; 212—antifuse gate layer; 220—second gate stack; 221—second gate medium layer; 222—control gate layer; 300—first voltage supply terminal; 400—second voltage supply terminal; 500—isolation structure.

DETAILED DESCRIPTION OF THE EMBODIMENTS

A limitation of the antifuse structure described in the background section is that its area, regulated by the design rules of two gate structures, is excessively large. As the integration level of integrated circuits continues to increase, the disadvantage of an excessively large area is more apparent.

To facilitate the understanding of the present disclosure, comprehensive descriptions are provided to the present disclosure with reference to the related accompanying drawings. The accompanying drawings illustrate some embodiments of the present disclosure. However, the present disclosure can be implemented in various forms and is not limited to the embodiments described herein. On the contrary, the purpose of providing these embodiments is to make the disclosure of the present disclosure more thorough and comprehensive.

Unless otherwise defined, all technical and scientific terms used herein have the same meanings as commonly understood by a person skilled in the technical field of the present disclosure. The terms used herein are only for the purpose of describing specific embodiments, and are not intended to limit the scope of the present disclosure.

It should be understood that when an element or a layer is referred to as being "on", "adjacent to", "connected to", or "coupled to" another element or layer, the element or layer may be directly on, adjacent to, connected to, or coupled to the other element or layer, or an intervening element or layer may exist therebetween. On the contrary, when an element is referred to as being "directly on", "directly adjacent to", "directly connected to", or "directly coupled to" another element or layer, no intervening element or layer exists therebetween. Although terms such as first, second, and third may be used to describe various elements, components, regions, layers, doping types, and/or portions, these elements, components, regions, layers, doping types, and/or portions should not be read as limited by these terms. Instead, these terms are merely used to distinguish one element, component, region, layer, doping type, or portion from another element, component, region, layer, doping type, or portion. Therefore, without departing from the teachings of the present invention, a first element, component, region, layer, doping type, or portion discussed below may be expressed as a second element, component, region, layer, or portion.

Spatial relationship terms such as "under", "down", "lower", "below", "on", and "above" may be herein used to describe the relationship between one element or feature and another element or feature shown in the figures. In addition to the orientations shown in the figures, the spatial relationship terms may also include different orientations of components in use and operation. For example, if the components in the figures are turned over, an element or feature described as being "under" or "below" another element will be oriented as "on" the other element or feature. Therefore, the exemplary terms "under" and "below" may include both orientations of above and below. In addition, a component may be otherwise oriented (for example, rotated 90 degrees or in another orientation), and the spatial descriptors used herein shall be interpreted accordingly.

When used herein, an expression of a singular form such as "a", "an", or "the/said" includes an expression of a plural form unless otherwise indicated. It should also be understood that the terms "composing" and/or "including" used herein specify the presence of described features, integers, steps, operations, elements, and/or components, but do not preclude the presence or addition of one or more other features, integers, steps, operations, elements, components, and/or groups. Meanwhile, when used herein, the term "and/or" includes any and all combinations of related listed items.

References are made herein to the schematic cross-sectional views of preferred embodiments (and intermediate structures) of the present invention to illustrate embodiments of the present invention. Changes to the shape shown in the figures due to various reasons, for example, manufacturing technology and/or tolerances, shall be expected. Therefore, the embodiments of the present invention shall not be construed as limited to the particular shapes of the regions as illustrated herein, but instead include deviations in shapes that are resulted from, for example, the manufacturing technology. Therefore, the regions shown in the figures are merely exemplary, and their shapes may not represent the actual shapes of the regions of the component, and do not intend to limit the scope of the present invention.

Figure 2:
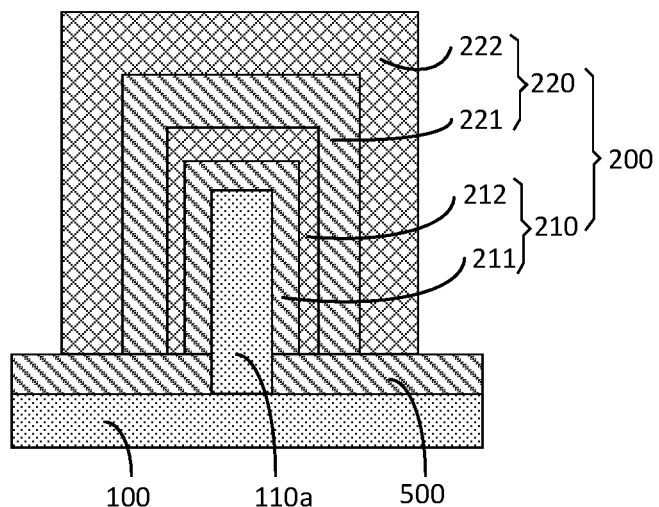
FIG. 2 is a schematic cross-sectional diagram of an antifuse structure according to one embodiment of the present disclosure.

Referring to FIGS. 1 and 2, this specification first provides an antifuse structure. The structure includes a substrate 100, a fin 110, and a gate stack structure 200.

The substrate 100 includes, but is not limited to, a silicon substrate. The fin 110 is located on the substrate 100, and may be a component of the substrate 100, or may be a semiconductor structure formed on the substrate 100, which is not limited in the present disclosure.

The fin 110 includes a first fin region 110a. The gate stack structure 200 is a gate structure with a plurality of stacked film layers, and surrounds the top and side walls of the first fin region 110a. A source region and a drain region may be formed on the two sides of the first fin region 110a.

In some embodiments, the gate stack structure 200 includes a first gate stack 210 and a second gate stack 220.

The first gate stack 210 covers the first fin region 110a. The second gate stack 220 covers the first gate stack 210.

The first gate stack 210 is configured to receive a first gate voltage, the second gate stack 220 is configured to receive a second gate voltage, and the first gate voltage is greater than the second gate voltage.

The outer layer of the fin 110 is surrounded by the stacked gate structure including the first gate stack 210 and the second gate stack 220. When the first gate voltage is not supplied to the first gate stack 210, the second gate stack 220, which is the outermost layer, receives the second gate voltage to form a conductive channel, and the current between the source and the drain is relatively small.

When the first gate voltage is supplied to the first gate stack 210, because the first gate voltage is relatively large, the first gate stack 210 may be broken down. In this case, when the second gate stack 220, which is the outermost layer, receives the second gate voltage to form a conductive channel, the current between the source and the drain becomes larger.

By breaking down the first gate stack 210, the gate control capability in this embodiment can be adjusted to distinguish the logic states "0" and "1".

In actual applications of the antifuse structure, different logic states "0" and "1" of the antifuse structure can be read by controlling whether the first gate voltage is provided to the first gate stack 210.

By properly setting a value of the second gate voltage to be supplied to the second gate stack 220, all conductive channels in the fin 110 are conducted when reading the logic states of the antifuse structure. Then, "0" and "1" may be read based on different currents between the source and the drain.

In this embodiment, the first gate stack 210 and the second gate stack 220 in the antifuse structure are stacked to form one gate stack structure 200. Therefore, the area of an antifuse unit can be effectively reduced, and the integration level of antifuse circuits can be greatly increased. Furthermore, due to the fin structure, conductive channels can be formed on the top and between the two side walls of the fin. Thus, compared to conventional structures of the same channel length, the structure of the present disclosure requires less space. Therefore, the size of the structure can be further reduced.

Referring to FIG. 1, in some embodiments, the fin 110 further includes a second fin region 110b.

The second fin region 110b is located on the two sides of the first fin region 110a. A source region and a drain region are respectively provided in the second fin region 110b located on the two sides of the first fin region 110a.

Ion implantation may be performed on the second fin region 110b to form the source region and the drain region.

Alternatively, in some embodiments, the fin 110 may not include the second fin region 110b. In this case, the source region and the drain region may be formed on the two sides of the first fin region 110a through epitaxial growth.

In some embodiments, as shown in FIGS. 1 and 2, the first gate stack 210 includes a first gate medium layer 211 and an antifuse gate layer 212. The first gate medium layer 211 may be an insulation layer such as oxide and may cover the first fin region 110a. The antifuse gate layer 212 may be a conductive layer such as polysilicon and may cover the first gate medium layer 211. The antifuse gate 212 may be configured to receive the first gate voltage.

When the antifuse gate layer 212 receives the first gate voltage, the first gate medium layer 211 covered by the antifuse gate layer 212 may be broken down by the first gate voltage and change from an insulated state to a conductive state, such that the current between the source and the drain may increase.

The second gate stack 220 includes a second gate medium layer 221 and a control gate layer 222. The second gate medium layer 221 may be an insulation layer such as oxide and may at least partially cover the antifuse gate layer 212. The control gate layer 222 may be a conductive layer such as polysilicon and may cover the second gate medium layer 221. The control gate layer 222 may be configured to receive the second gate voltage.

When the control gate layer 222 receives the second gate voltage, the conductive channel in the fin 110 may be conducted.

The materials of the first gate medium layer 211 and the second gate medium layer 221 may be the same or different, which is not limited in the present disclosure. The materials of the control gate layer 222 and the antifuse gate layer 212 may be the same or different, which is not limited in the present disclosure either.

Further, in this embodiment, the thickness of the second gate medium layer 221 may be greater than the thickness of the first gate medium layer 211.

The second gate medium layer 221 and the first gate medium layer 211 are respectively located on the two sides of the antifuse gate layer 212. When the antifuse gate layer 212 receives the first gate voltage breaking down the first gate medium layer 211, the second gate medium layer 221 is inevitably affected.

Therefore, the thickness of the second gate medium layer 221 is set to be greater than the thickness of the first gate medium layer 211 to effectively reduce the impact on the second gate medium layer 221 when the first gate medium layer 211 is broken down.

In some embodiments, the thickness of the first gate medium layer 211 may be between 1.5 nm to 2.5 nm, and the thickness of the second gate medium layer 221 may be between 4.5 nm to 6 nm to ensure that the second gate medium layer 221 is not damaged during the breakdown and fuse of the first gate medium layer 211, thereby ensuring the reliability of the product. Further, the range of the first gate voltage may be between 5 V to 6 V and the range of the second gate voltage may be between 2 V to 3 V.

In some embodiments, the second gate medium layer 221 may be protected by other means. For example, the dielectric constant of the second gate medium layer 221 may be set to be greater than the dielectric constant of the first gate medium layer 211.

Figure 3:
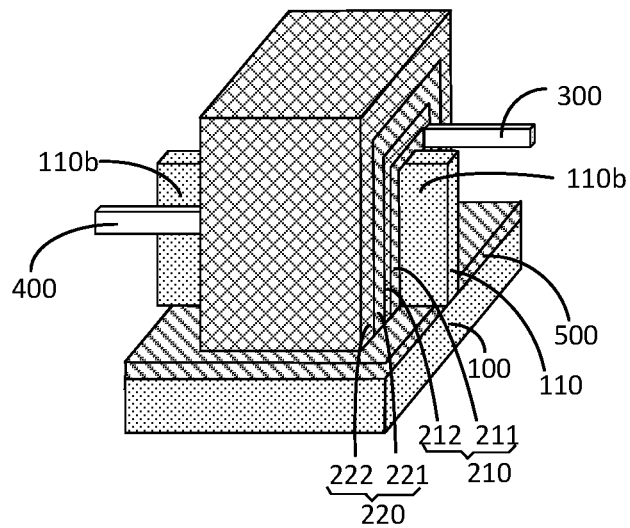
FIG. 3 is a schematic three-dimensional diagram of an antifuse structure according to one embodiment of the present disclosure.

Referring to FIG. 3, in some embodiments, the first gate stack 210 is connected to a first voltage supply terminal 300. The first voltage supply terminal 300 is a structural terminal for connecting to the first gate voltage. More specifically, the antifuse gate layer 212 may be set to be connected to the first voltage supply terminal 300.

The second gate stack 220 is connected to a second voltage supply terminal 400. The second voltage supply terminal 400 is a structural terminal for connecting to the second gate voltage. More specifically, the control gate layer 222 may be set to be connected to the second voltage supply terminal 400.

In some embodiments, the first voltage supply terminal 300 and the second voltage supply terminal 400 are set to be extended towards opposite sides of the gate stack structure 200. That is, the first voltage supply terminal 300 and the second voltage supply terminal 400 are located on the two opposite sides of the gate stack structure 200. Thus, signal coupling interference between the first voltage supply terminal 300 and the second voltage supply terminal 400 can be effectively prevented.

The extension directions of the first voltage supply terminal 300 and the second voltage supply terminal 400 may be parallel to the extension direction of the gate stack structure 200. Doing so allows the first voltage supply terminal 300 and the second voltage supply terminal 400 be flexibly placed while ensuring the integrity of the gate stack structure 200.

In some embodiments, as shown in FIGS. 1 and 2, the substrate 100 may be further provided with an isolation structure 500. The isolation structure 500 is located on the two opposite sides of the fin 110 and is located between the substrate 100 and the gate stack structure 200.

The substrate 100 may be provided with a plurality of fins 110. In this case, due to the isolation structure 500, the fins 110 can be effectively isolated from each other to form a plurality of component regions.

Figure 4:
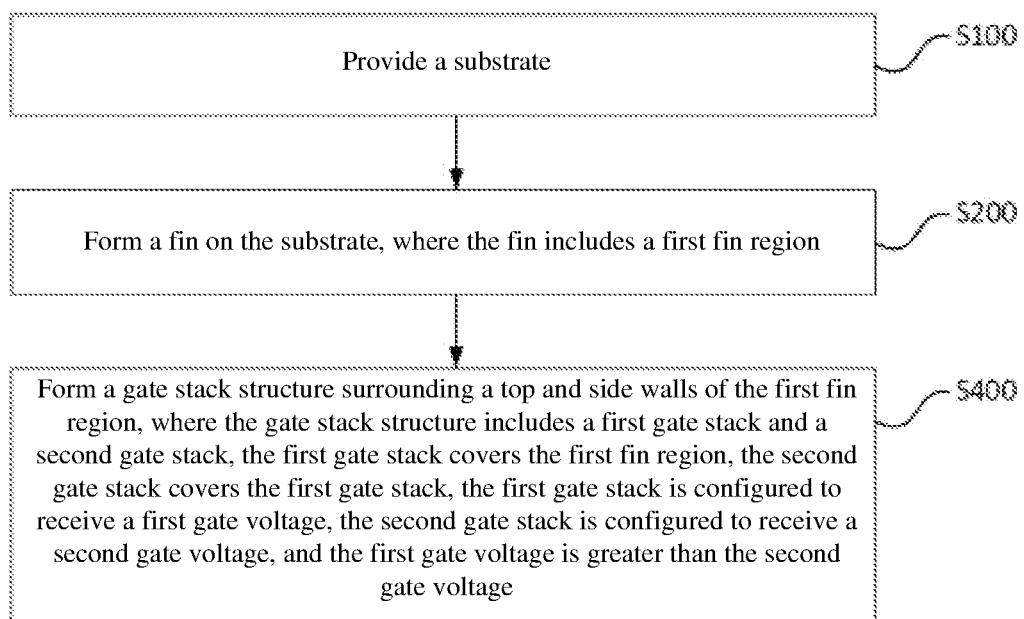
FIG. 4 is a flowchart of a method for manufacturing an antifuse structure according to one embodiment of the present disclosure.

Referring to FIG. 4, this specification further provides a method for manufacturing an antifuse structure. The method includes the following steps.

Figure 6:
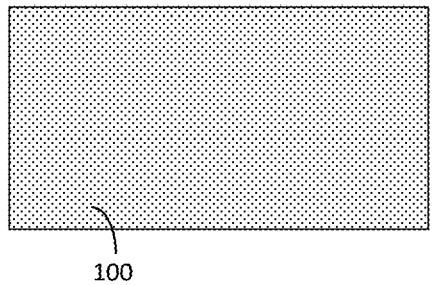
FIGS. 6, 7, 8, 9, 10, 11, and 12 are schematic three-dimensional structural diagrams in the process of forming an antifuse structure according to one embodiment of the present disclosure.

In step S100, a substrate 100, as shown in FIG. 6, is provided.

Figure 7:
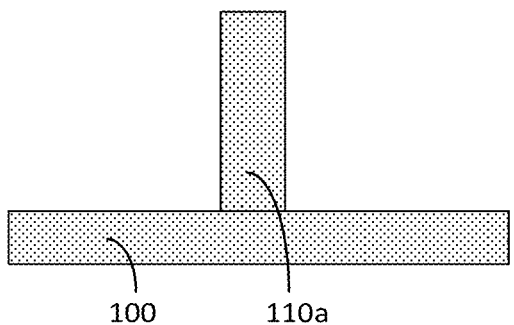

In step S200, a fin 110 is formed on the substrate 100. The fin 110 includes a first fin region 110a, as shown in FIG. 7.

Figure 12:
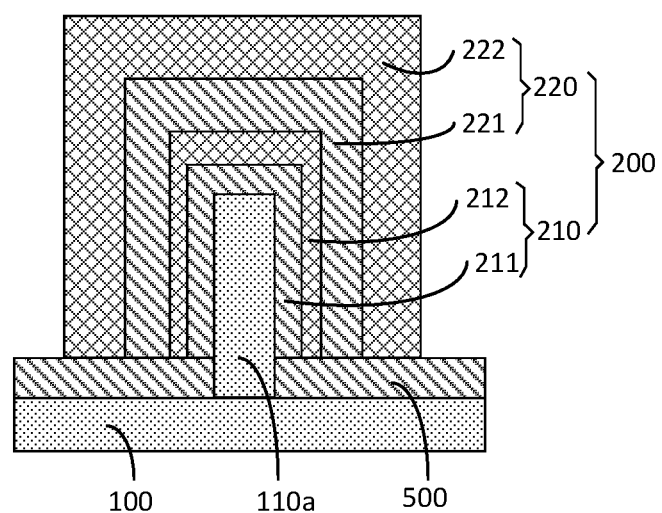

In step S400, a gate stack structure 200 surrounding the top and side walls of the first fin region 110a is formed, as shown in FIG. 12. The gate stack structure 200 includes a first gate stack 210 and a second gate stack 220. The first gate stack 210 covers the first fin region 110a, the second gate stack 220 covers the first gate stack 210. The first gate stack 210 is configured to receive a first gate voltage, the second gate stack 220 is configured to receive a second gate voltage, and the first gate voltage is greater than the second gate voltage.

In some embodiments, the first gate stack 210 and the second gate stack 220 in the antifuse structure are stacked to form the gate stack structure 200. By doing so, the area of an antifuse unit can be effectively reduced, and the integration level of antifuse circuits can be greatly increased. In addition, the arrangement of a fin structure can further reduce the size and save more space.

In some embodiments, the fin 110 further includes a second fin region 110b. The second fin region 100b is located on the two sides of the first fin region 110a.

After step S400, the method may further include step S500.

In step S500, ion implantation is performed on the second fin region 110b located on the two sides of the first fin region 110a to form a source region and a drain region, as shown in FIG. 1.

The fin 110 between the source region and the drain region constitutes a channel region. The channel region is configured to form a conductive channel, and located near the surface of the fin 110 close to the gate stack structure 200.

In some embodiments, the fin 110 may alternatively not be provided with the second fin region 110b. In this case, after step S400, the source region and the drain region may be formed on the two sides of the first fin region 110a through epitaxial growth.

In some embodiments, step S400 includes the following steps.

Figure 9:
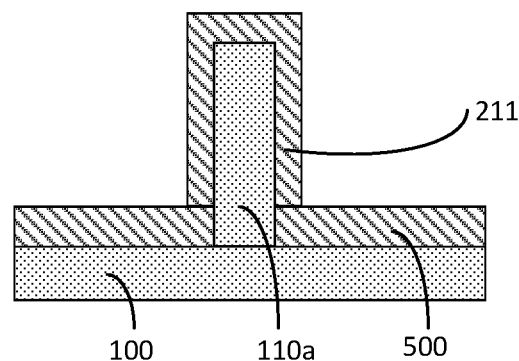

In step S410, a first gate medium layer 211 is formed on the surface of the first fin region 110a, as shown in FIG. 9.

Figure 10:
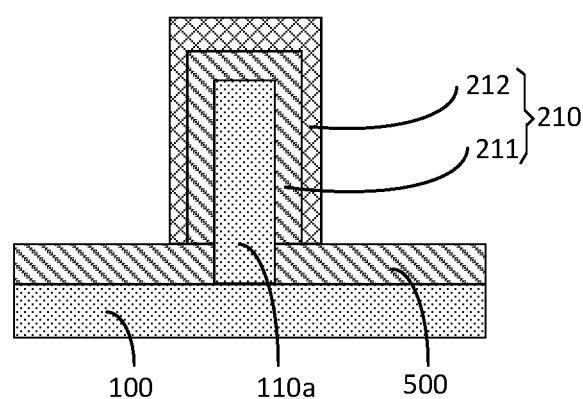

In step S420, an antifuse gate layer 212 is formed on the surface of the first gate medium layer 211, as shown in FIG. 10. The first gate medium layer 211 and the antifuse gate layer 212 form the first gate stack 210.

Figure 11:
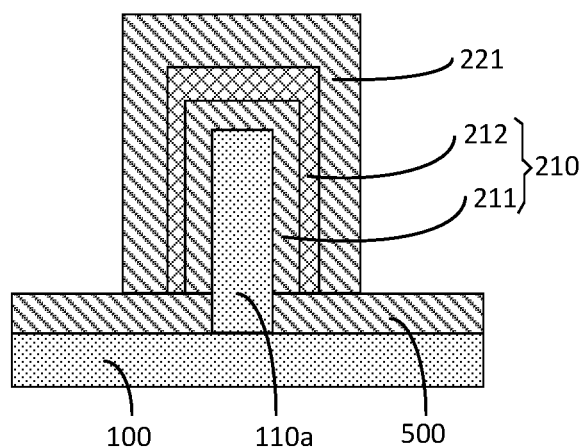

In step S430, a second gate medium layer 221 is formed on at least a part of the surface of the antifuse gate layer 210, as shown in FIG. 11.

In step S440, a control gate layer 222 is formed on the surface of the second gate medium layer 221, as shown in FIG. 12. The second gate medium layer 221 and the control gate layer 222 form the second gate stack 220.

In some embodiments, the thickness of the first gate medium layer 211 is less than the thickness of the second gate medium layer 221.

In some embodiments, after step S400, the method further includes the following steps.

In step S600, a first voltage supply terminal 300 connected to the first gate stack 210 is formed on one side of the gate stack structure 200, as shown in FIG. 3.

In step S700, a second voltage supply terminal 400 connected to the second gate stack 220 is formed on another side of the gate stack structure 200, as shown in FIG. 3. The second voltage supply terminal 400 is disposed opposite to the first voltage supply terminal 300.

In some embodiments, the extension directions of the first voltage supply terminal 300 and the second voltage supply terminal 400 are parallel to the extension direction of the gate stack structure 200.

In some embodiments, step S200 includes the following steps.

In step S210, a patterned mask layer is formed on the substrate 100.

In step S220, a patterning process is performed on the substrate 100 based on the patterned mask layer to form the fin 110.

In step S210, a mask material layer may be formed on the substrate 100 first. Then, a photoresist layer is formed on the mask material layer, and a patterned photoresist is formed through exposure and development. Next, the mask material layer is etched based on the patterned photoresist to form the patterned mask layer.

In step S220, the substrate 100 may be etched based on the patterned mask layer by using an anisotropic etching method to form the fin 110.

The method for forming the fin 110 is not limited thereto. For example, an epitaxial layer may be formed on the substrate 100, and then a patterning process is performed on the epitaxial layer to obtain the fin 110.

In some embodiments, before step S400, the method further includes the following step.

Figure 8:
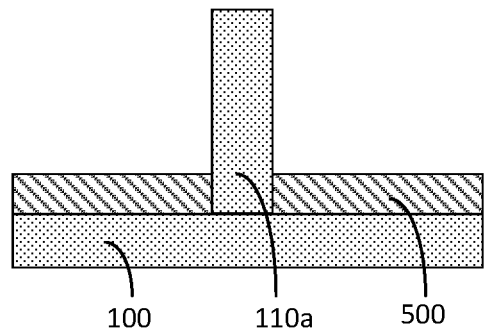

In step S300, an isolation structure 500 is formed on the two opposite sides of the fin 110, as shown in FIG. 8.

Specifically, first, an isolation material layer may be deposited by using a chemical vapor deposition method to cover the fin 110 and the substrate 100. Then, chemical-mechanical polishing may be performed based on the patterned mask layer formed in step S220 to planarize the isolation material layer and expose the patterned mask layer. Subsequently, the excessive portion of the isolation material layer on the fin 110 is removed through wet etching with a high selectivity ratio, and the isolation material layer located at the bottom is retained to serve as the isolation structure 500. Then, the patterned mask layer is removed.

For specific limitations and technical effects of the method for manufacturing the antifuse structure, reference can be made to the foregoing limitations of the antifuse structure, the details of which are omitted herein.

Figure 5:
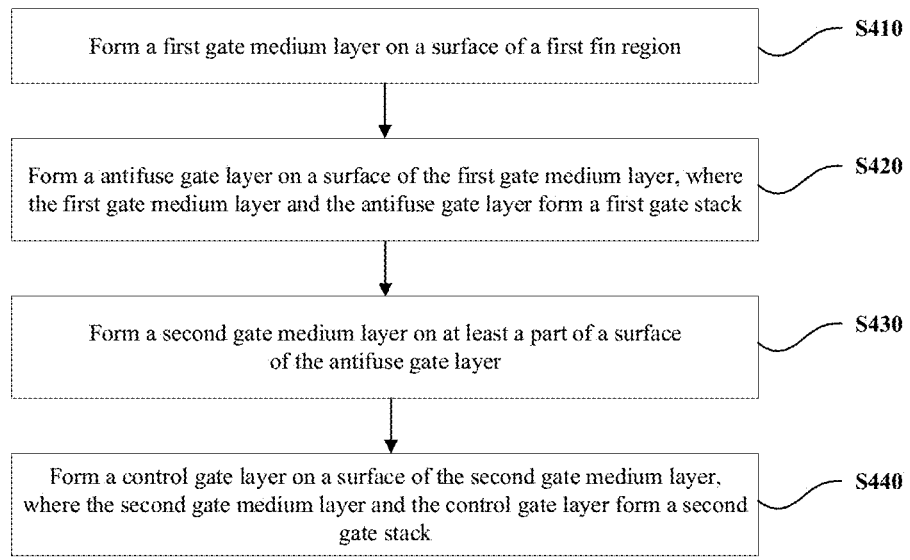
FIG. 5 is a flowchart of a method for manufacturing a gate stack structure according to one embodiment of the present disclosure.

Although various steps in the flowcharts of FIGS. 4 and 5 are displayed in sequence as indicated by the arrows, these steps are not necessarily performed in sequence in such order indicated by the arrows. Unless otherwise expressly stated, there is no strict order for the execution of these steps, and these steps can be executed in other orders. Moreover, at least some steps in FIGS. 4 and 5 may include a plurality of steps or stages. These steps or stages are not necessarily completed at the same moment, but instead may be executed at different moments. These steps or stages are not necessarily performed in sequence, but instead may be performed alternately with at least a part of another step or stage.

The technical features of the foregoing embodiments may be combined arbitrarily. For brevity purposes, not all possible combinations of the technical features of the foregoing embodiments are described herein. However, all the combinations of these technical features, provided that there is no contradiction to combine them, shall be considered as being within the scope described in this specification.

The foregoing embodiments merely illustrate certain implementations of the present disclosure. The descriptions thereof are relatively specific and detailed. However, they should not be understood as limiting the scope of the present disclosure. A person of ordinary skill in the art can make further modifications and improvements hereto without departing from the concept of the present disclosure, which shall be understood as being within the protection scope of the present disclosure. Therefore, the protection scope of the present disclosure shall be subject to the appended claims.

What is claimed is:

1. An antifuse structure, comprising:
   a substrate;
   a fin, located on the substrate and comprising a first fin region; and
   a gate stack structure, surrounding a top and side walls of the first fin region, wherein the gate stack structure comprises a first gate stack and a second gate stack, the first gate stack covers the first fin region, the second gate stack covers the first gate stack, the first gate stack is configured to receive a first gate voltage, the second gate stack is configured to receive a second gate voltage, and the first gate voltage is greater than the second gate voltage.

2. The antifuse structure of claim 1, wherein the fin further comprises a second fin region located on two sides of the first fin region, wherein the second fin region located on the two sides of the first fin region is respectively provided with a source region and a drain region.

3. The antifuse structure of claim 1, wherein the first gate stack comprises a first gate medium layer and an antifuse gate layer covering the first gate medium layer, the first gate medium layer covers the first fin region, and the antifuse gate layer is configured to receive the first gate voltage, and
   wherein the second gate stack comprises a second gate medium layer and a control gate layer covering the second gate medium layer, the second gate medium layer at least partially covers the antifuse gate layer, and the control gate layer is configured to receive the second gate voltage.

4. The antifuse structure of claim 3, wherein a thickness of the first gate medium layer is less than a thickness of the second gate medium layer.

5. The antifuse structure of claim 1, wherein the first gate stack is connected to a first voltage supply terminal, the second gate stack is connected to a second voltage supply terminal, and the first voltage supply terminal and the second voltage supply terminal extend towards opposite sides of the gate stack structure.

6. The antifuse structure of claim 5, wherein extension directions of the first voltage supply terminal and the second voltage supply terminal are parallel to an extension direction of the gate stack structure.

7. The antifuse structure of claim 1, further comprising:
an isolation structure on the substrate, wherein the isolation structure is located on two opposite sides of the fin and is located between the substrate and the gate stack structure.

8. A method for manufacturing an antifuse structure, comprising:
providing a substrate;
forming a fin on the substrate, wherein the fin comprises a first fin region; and
forming a gate stack structure surrounding a top and side walls of the first fin region, wherein the gate stack structure comprises a first gate stack and a second gate stack, the first gate stack covers the first fin region, the second gate stack covers the first gate stack, the first gate stack is configured to receive a first gate voltage, the second gate stack is configured to receive a second gate voltage, and the first gate voltage is greater than the second gate voltage.

9. The method for manufacturing an antifuse structure of claim 8, wherein the fin further comprises a second fin region located on two sides of the first fin region, and wherein after the forming a gate stack structure surrounding a top and side walls of the first fin region, the method further comprises:
performing ion implantation on the second fin region located on the two sides of the first fin region to form a source region and a drain region.

10. The method for manufacturing an antifuse structure of claim 8, wherein the forming a gate stack structure surrounding a top and side walls of the first fin region comprises:
forming a first gate medium layer on a surface of the first fin region;
forming an antifuse gate layer on a surface of the first gate medium layer, wherein the first gate medium layer and the antifuse gate layer form the first gate stack;
forming a second gate medium layer on at least a part of a surface of the antifuse gate layer; and
forming a control gate layer on a surface of the second gate medium layer, wherein the second gate medium layer and the control gate layer form the second gate stack.

11. The method for manufacturing an antifuse structure of claim 10, wherein a thickness of the first gate medium layer is less than a thickness of the second gate medium layer.

12. The method for manufacturing an antifuse structure of claim 8, wherein after the forming a gate stack structure surrounding a top and side walls of the first fin region, the method further comprises:
forming a first voltage supply terminal connected to the first gate stack on a first side of the gate stack structure; and
forming a second voltage supply terminal connected to the second gate stack on a second side of the gate stack structure, wherein the second voltage supply terminal is disposed opposite to the first voltage supply terminal.

13. The method for manufacturing an antifuse structure of claim 12, wherein extension directions of the first voltage supply terminal and the second voltage supply terminal are parallel to an extension direction of the gate stack structure.

14. The method for manufacturing an antifuse structure of claim 8, wherein the forming a fin on the substrate comprises:
forming a patterned mask layer on the substrate; and
performing a patterning process on the substrate based on the patterned mask layer to form the fin.

15. The method for manufacturing an antifuse structure of claim 8, wherein the forming a fin on the substrate comprises:
forming a patterned mask layer on the substrate; and
forming an epitaxial layer on the substrate, and performing a patterning process on the epitaxial layer to obtain the fin.

16. The method for manufacturing an antifuse structure of claim 8, wherein before the forming a gate stack structure surrounding a top and side walls of the first fin region, the method further comprises:
forming an isolation structure on two opposite sides of the fin.

17. The method for manufacturing an antifuse structure of claim 16, wherein the forming an isolation structure on two opposite sides of the fin comprises:
depositing an isolation material layer through a chemical vapor deposition process to cover the fin and the substrate;
performing a chemical mechanical polishing process based on the patterned mask layer to planarize the isolation material layer and expose the patterned mask layer;
removing an excessive portion of the isolation material layer on the fin through a wet etching process with a high selectivity ratio, while retaining the isolation material layer located at a bottom to serve as the isolation structure; and
removing the patterned mask layer.

\* \* \* \* \*